(12) United States Patent
Rieve et al.

(10) Patent No.: US 7,053,457 B2
(45) Date of Patent: May 30, 2006

(54) OPTO-ELECTRONIC COMPONENT

(75) Inventors: Peter Rieve, Windeck-Dattenfeld (DE); Jens Prima, Gehrde (DE); Konstantin Seibel, Siegen (DE); Marcus Walder, Wipperfürth (DE)

(73) Assignee: STMicroelectronics NV, Amsterdam (NL)

( * ) Notice: Subject to any disclaimer, the term of this patent is extended or adjusted under 35 U.S.C. 154(b) by 28 days.

(21) Appl. No.: 10/469,514

(22) PCT Filed: Feb. 26, 2002

(86) PCT No.: PCT/EP02/02016

§ 371 (c)(1),
(2), (4) Date: Apr. 12, 2004

(87) PCT Pub. No.: WO02/071497

PCT Pub. Date: Sep. 12, 2002

(65) Prior Publication Data

US 2004/0155311 A1    Aug. 12, 2004

(30) Foreign Application Priority Data

Mar. 1, 2001 (DE) .................. 101 09 984

(51) Int. Cl.
- *H01L 31/00* (2006.01)
- *H01L 29/04* (2006.01)
- *H01L 31/0376* (2006.01)
- *H01L 31/20* (2006.01)
- *H01L 31/036* (2006.01)

(52) U.S. Cl. ............... 257/449; 257/444; 257/440; 257/59

(58) Field of Classification Search .............. None
See application file for complete search history.

(56) References Cited

U.S. PATENT DOCUMENTS

| | | | |
|---|---|---|---|
| 4,969,025 A | * | 11/1990 | Yamamoto et al. ......... 257/56 |
| 5,291,036 A | | 3/1994 | Tran et al. |
| 5,324,553 A | * | 6/1994 | Ovshinsky et al. ......... 427/571 |

(Continued)

FOREIGN PATENT DOCUMENTS

EP      0 437 633 A1      7/1991

(Continued)

*Primary Examiner*—Nathan J. Flynn
*Assistant Examiner*—Victor A. Mandala, Jr.
(74) *Attorney, Agent, or Firm*—Lisa K. Jorgenson; James H. Morris; Wolf, Greenfield & Sacks, P.C.

(57) ABSTRACT

The invention relates to an opto-electronic component for converting electromagnetic radiation into an intensity-dependent photocurrent, comprising a substrate (1) with a microelectronic circuit whose surface is provided with a first layer (7) which is electrically contacted thereto and made of amorphous silicon a-i:H or alloys thereof, and at least one other optically active layer (8) is disposed upstream from said first layer in the direction of incident light thereof (7). The invention also relates to the production thereof. The aim of the invention is to improve upon an opto-electronic component of the above-mentioned variety in order to obtain high spectral sensitivity within the visible light range and, correspondingly, significantly reduce sensitivity to radiation in the infrared range without incurring any additional construction costs. The invention is characterized in that a component is produced using a material in the intrinsic absorption layer (7) which is modified by an additional hydrocarbon content corresponding to alloy conditions, whereupon photons whose energy is less than the energy gap between two bands are absorbed only in reverse contact of the component which is sealed off from the substrate, as opposed to being absorbed in the first layer.

37 Claims, 4 Drawing Sheets

U.S. PATENT DOCUMENTS

| | | | |
|---|---|---|---|
| 5,366,713 A | 11/1994 | Sichanugrist et al. | |
| 5,536,933 A * | 7/1996 | Izumi et al. | 250/208.2 |
| 5,723,877 A | 3/1998 | Sugawa et al. | |
| 5,888,452 A * | 3/1999 | Lin et al. | 420/578 |
| 5,936,261 A | 8/1999 | Ma et al. | |
| 5,942,049 A * | 8/1999 | Li et al. | 136/258 |
| 6,127,692 A | 10/2000 | Sugawa et al. | |
| 6,373,117 B1 | 4/2002 | Theil | |
| 6,723,421 B1 * | 4/2004 | Ovshinsky et al. | 428/315.7 |
| 6,784,361 B1 * | 8/2004 | Carlson et al. | 136/258 |

FOREIGN PATENT DOCUMENTS

| | | |
|---|---|---|
| EP | 0 438 889 A1 | 7/1991 |
| EP | 0 573 033 A1 | 12/1993 |
| EP | 1 045 450 A2 | 10/2000 |
| EP | 1 050 907 A2 | 11/2000 |

\* cited by examiner

OPTO-ELECTRONIC COMPONENT

BACKGROUND OF THE INVENTION

1. Field of the Invention

The invention relates to an optoelectronic component for conversion of electromagnetic radiation to an intensity-dependent photocurrent comprising a substrate with a microelectronic circuit, on whose surface a first layer which makes electrical contact with this and is composed of intrinsically conductive amorphous silicon a-Si:H or of its alloys is arranged, with at least one further optically active layer being arranged upstream in the light incidence direction of the first layer, and to a method for producing it.

2. Discussion of the Related Art

In the case of image sensors, which are intended to be used for recording optical radiation from the visible spectral band, matching to the spectral sensitivity of the human eye is of major importance, in order to achieve calorimetrically exact reproduction of colored image contents. This visible spectral band is between wavelengths of 380 nm and about 680 nm, with the lower boundary area being determined by the ultraviolet radiation area and the upper area being determined by the infrared radiation area. However, conventional image sensors are subject to the problem that, owing to the material characteristics of the silicon, they have significant sensitivity even beyond the visible band, in the infrared band as well. In order to avoid the image signal being corrupted by infrared components, additional measures must therefore be adopted.

On the one hand, it is known that an optical color filter system which is constructed pixel-by-pixel can be applied to the photoactive layers (U.S. Pat. No. 3,971,065).

On the other hand, it is known that additional filters can be used to suppress undesirable infrared radiation, for example interference filters or colored glass filters, which suppress light at a wavelength above about 680 nm.

Filters such as these on the one hand have the disadvantage that they represent additional design and manufacturing complexity, for example if they are installed in the optical beam path of a camera system, integrated in the lens system, and on the other hand have the disadvantage that they also absorb a not inconsiderable proportion of the light in the desired visible spectral band, and thus reduce the overall sensor sensitivity.

SUMMARY OF THE INVENTION

Against this background, the invention is based on the object of improving an optoelectronic component of the type mentioned initially so as to achieve high spectral sensitivity in the visible light band and, in a corresponding manner, a high degree of suppression of the sensitivity to radiation in the infrared band without any additional design complexity.

According to the invention, this and other objects are achieved in that the first layer is produced from intrinsically conductive amorphous silicon by alloying it with carbon in a concentration of 2 to 15% by atomic weight, such that the band gap of the semiconductor material in the first layer is at least 1.8 eV.

Technologically, this layer is produced using the PECVD method from silane ($SiH_4$) and methane ($CH_4$), with the silane/methane mixture ratio being between 2:1 and 1:1. This results in layers with a carbon concentration of 2 to 15% by atomic weight. Furthermore, the silane/methane gas mixture can be diluted by the addition of hydrogen ($H_2$) in order to improve the electrical layer quality. The preferred proportion of hydrogen by volume, with respect to the total gas mixture, is 75 to 95% by volume. Other gases containing silicon and/or carbon may also be used instead of silane and methane, for example $Si_2H_6$, $C_2H_2$, $C_2H_4$, $C_2H_6$, or else gases which contain both silicon and carbon, for example $(SiH_3)CH_3$.

The invention is distinguished in that a component is produced in which a material which is changed to match the alloying conditions is used in the intrinsically conductive absorption layer. This ensures that photons with an energy of less than the band gap are not absorbed in the first layer, but only in the rear contact of the component, which closes the component off from the substrate. However, at this point, the photons do not contribute to the generation of the photocurrent. As a consequence, the component has noticeable infrared suppression and thus renders superfluous the infrared blocking filters which are used in sensor systems manufactured according to the prior art.

According to one embodiment, the invention provides for the microelectronic circuit to be a single semiconductor transistor in each pixel. This results in what is referred to as a TFT transistor (Thin Film Transistor). Alternatively, a switching diode can also be used.

A component such as this can also be used in the X-ray radiation band by applying a further X-ray active scintillation layer.

According to another embodiment of the invention, the microelectronic circuit is an application specific circuit (ASIC), with the at leats one further layer being a doped semiconductive layer upstream of which, in the light incidence direction, a conductive layer composed of a transparent oxide (TCO) is arranged.

This embodiment results in a component in the form of a TFA sensor (Thin Film on ASIC) which represents an image sensor that is organized pixel-by-pixel, by virtue of the structured semiconductor component being arranged such that it is organized pixel-by-pixel in the form of a matrix. In this case, the electronic circuits for operation of the sensor, that is to say the pixel electronics, the peripheral electronics and the system electronics, are normally produced using CMOS-based silicon technology, and thus form the application-specific integrated circuit (ASIC) in the substrate. A multilayer arrangement is located vertically on the ASIC, separated from it by an insulating layer and connected to it by means of appropriate electrical contacts, in the form of a photodiode which converts the electromagnetic radiation to an intensity-dependent photocurrent. This photocurrent is passed through specific contacts which are provided in each pixel, for the pixel electronics which are located underneath.

If the photodiode is produced using the material that is defined by the specifications mentioned above, this results in an optoelectronic conversion means which is in the form of a photodiode and is in the form of a TFA image sensor with integrated infrared suppression, and which may either be a photodiode with the layer sequence n-i-p, p-i-n, or a photodiode in the form of a Schottky diode. In the case of the p-i-n- or n-i-p structure, a further differently conductive layer is introduced between the intrinsically conductive layer and the rear electrode.

Further preferred embodiments can be found in the further dependent claims.

BRIEF DESCRIPTION OF THE DRAWINGS

The invention will be explained in more detail in the following text with reference to drawings, in which.

DETAILED DESCRIPTION

Figure 1:
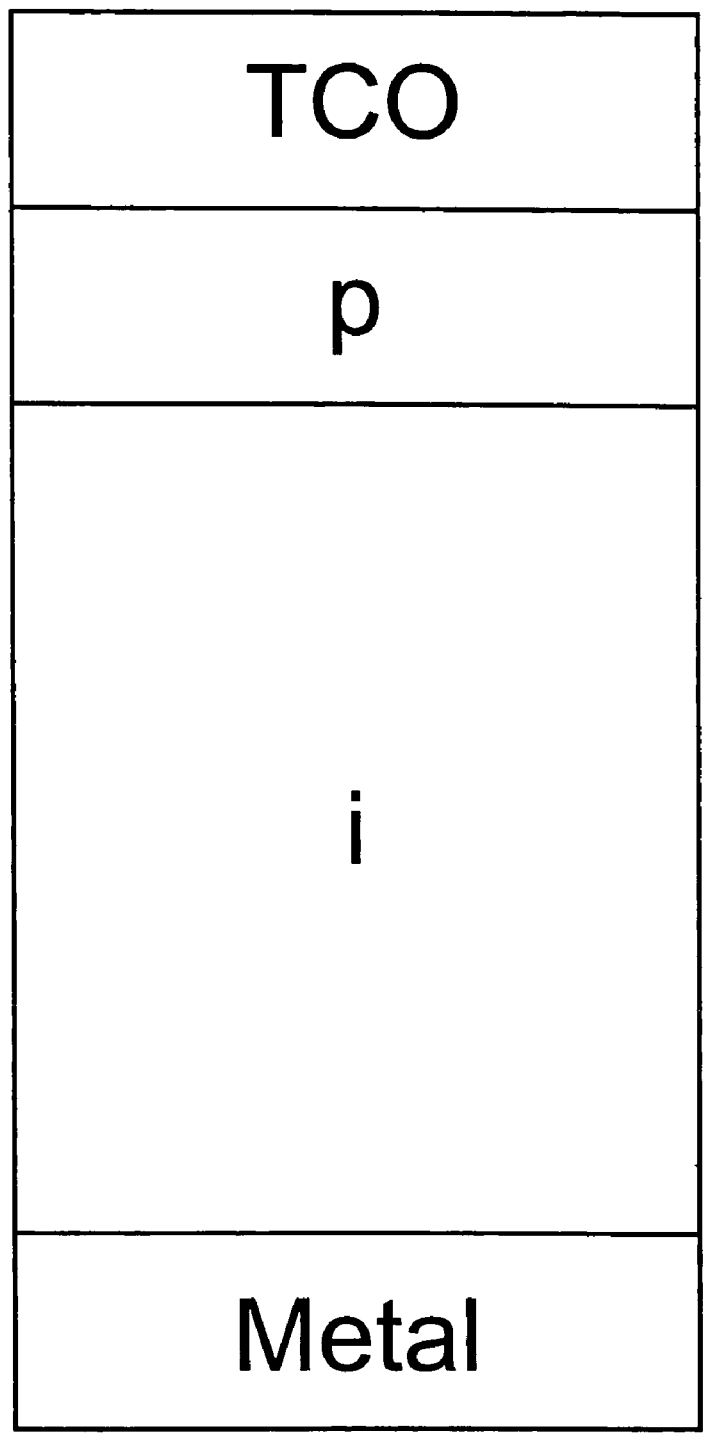
FIG. 1 shows the layer structure of an optoelectronic component which is known from the prior art.

FIG. 1 shows an optoelectronic component as is in principle known from the prior art on the basis of its layer structure. In this case, a metal layer is first of all located on the substrate (which is not shown). An intrinsically conductive layer (i) composed of amorphous silicon (a-Si:H) is arranged above this, above which in turn a p-doped semiconductive layer is arranged and, furthermore, arranged in front of this in the light incidence direction, a transparent conductive oxide layer (TCO). The component which is formed in this way is referred to as a "Schottky photodiode".

The intrinsically conductive layer (i) is composed of amorphous silicon and normally has a band gap of about 1.7 eV. The spectral sensitivity of a component such as this is illustrated by the curve profile a in FIG. 4. This shows that there is still a considerable sensitivity above the visible 680 nm band (that is to say in the infrared band), which can no longer be seen by the human eye, which is undesirable (see above).

Figure 2:
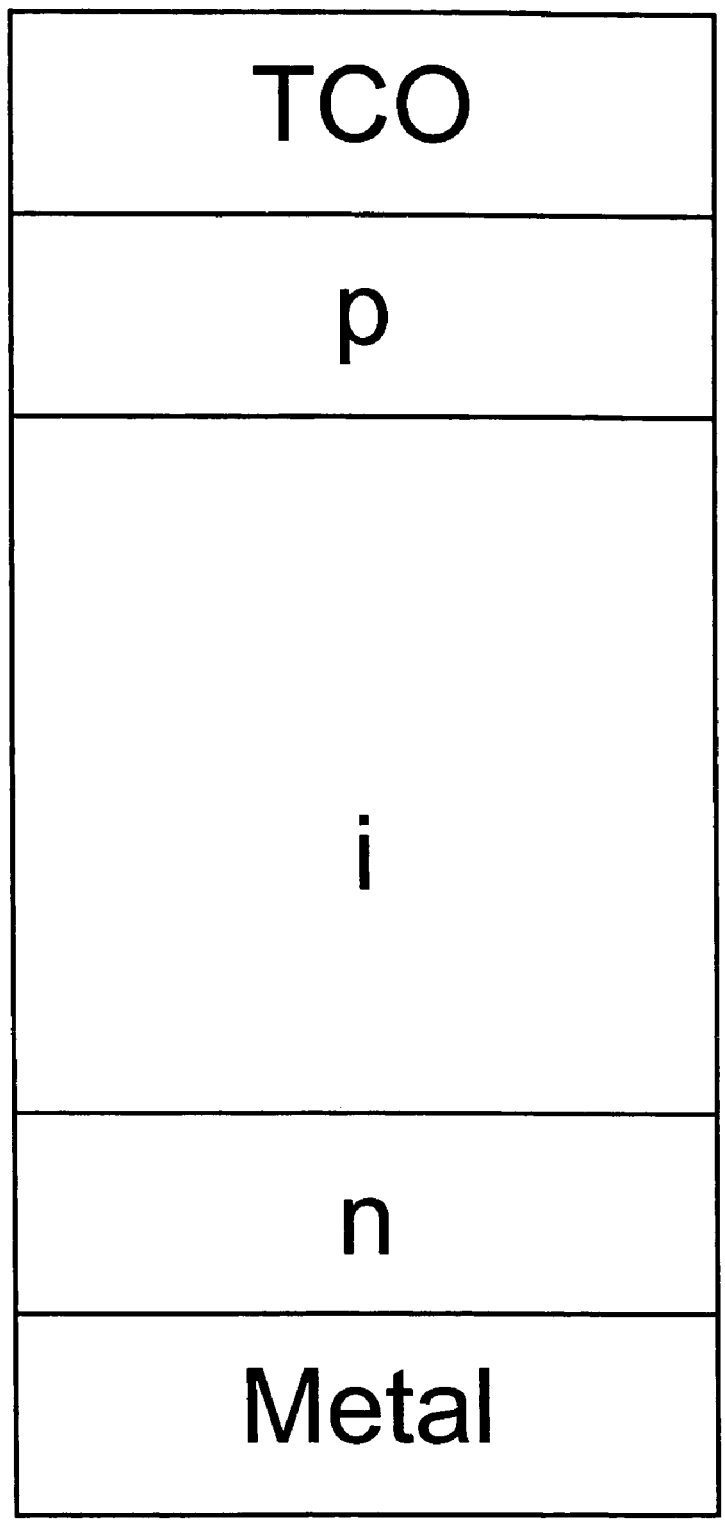
FIG. 2 shows the layer structure of a further electronic component which is known from the prior art.

FIG. 2 shows a second optoelectronic component, which represents what is referred to as a p-i-n photodiode that is known per se. In comparison to the layer sequence illustrated in FIG. 1, this element additionally has an n-doped semiconductor layer as well between the metal contact with the substrate and the intrinsically conductive a-Si:H layer. With this component as well, the band gap of about 1.7 eV results in a spectral sensitivity profile approximately corresponding to curve a in FIG. 4 in the i area.

Figure 3:
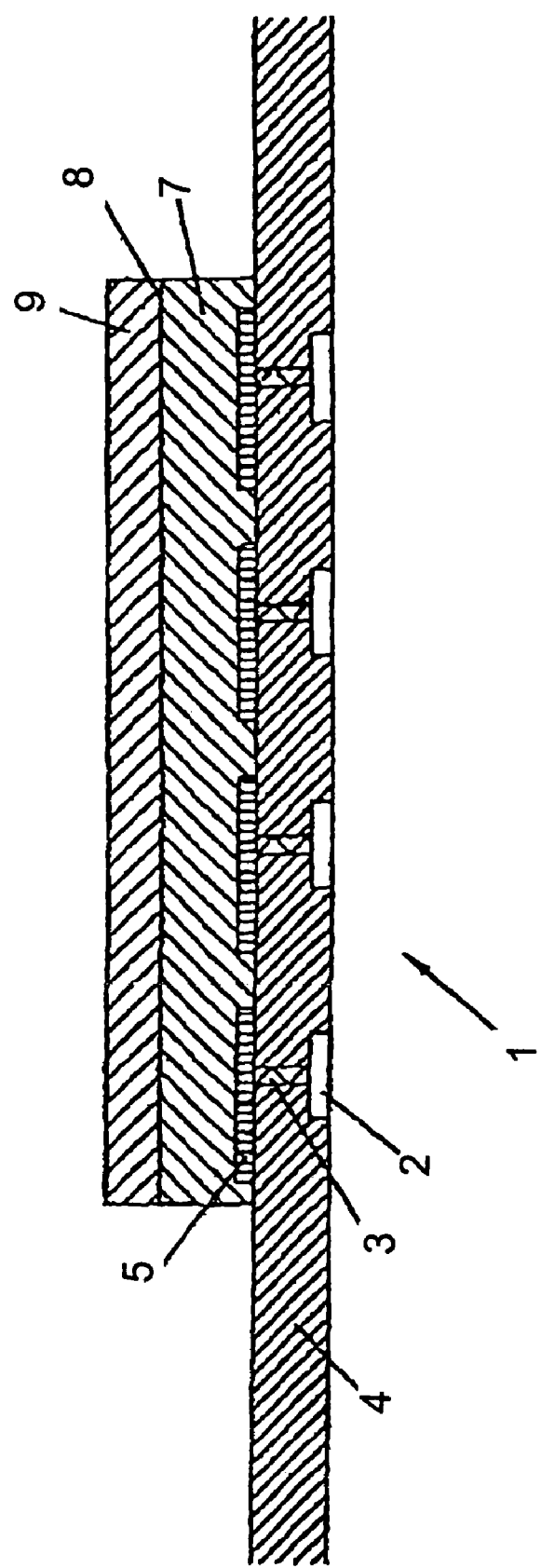
FIG. 3 shows the layer structure of an optoelectronic component according to one exemplary embodiment of the invention.

FIG. 3 shows the configuration of an image sensor produced using thin film on ASIC technology.

The optoelectronic component that is illustrated in FIG. 3 comprises a substrate 1, that is to say a silicon substrate, on whose surface corresponding integrated circuits are formed. These integrated circuits are produced using CMOS technology, and the circuit formed in this way is referred to as an application specific integrated circuit ASIC.

The substrate 1 with the ASIC has an insulating layer 4 as the uppermost layer, what is referred to as an intermetallic dielectric layer which has been planarized using the chemical mechanical polishing process, so that metallic contacts, that is to say horizontal connecting means 2 and vias 3, are embedded in the intermetallic dielectric layer such that they do not cause any significant surface roughness. The connections between the individual metal layers 2 are made by connecting vias 3 composed of tungsten. These are also referred to as tungsten plugs. A barrier layer, for example composed of titanium nitride, is also inserted between the insulating layer 4 and the metal layer 5, which will be described in the following text. A metal layer 5, preferably composed of chrome, is located above this barrier layer and has a thickness of 100 nm or less and is applied, for example, by the sputtering process. This metal layer is structured so as to produce rear electrodes for individual picture elements (pixels) in this way. An intrinsically conductive layer 7 composed of amorphous or microcrystalline silicon or of its alloys is located above the metal layer 5 and has a typical thickness of about 0.5 µm to 2 µm, and is preferably applied using the PECVD method. Finally, a p-conductive layer composed of amorphous or microcrystalline silicon 8 or of its alloys is located above the intrinsically conductive layer 7 and has a typical thickness of about 5 nm to 20 nm. A front contact in the form of a conductive transparent oxide layer 9 is located on the p-conductive layer 8. The material which is used for this propose is preferably aluminum-doped zinc oxide, aluminum-oxide-doped zinc oxide or else indium-tin oxide.

The layer sequence of metal-chrome/intrinsically conductive amorphous silicon results in the structure of a Schottky diode in the form of a metal-semiconductor junction on a planarized ASIC surface.

Figure 4:
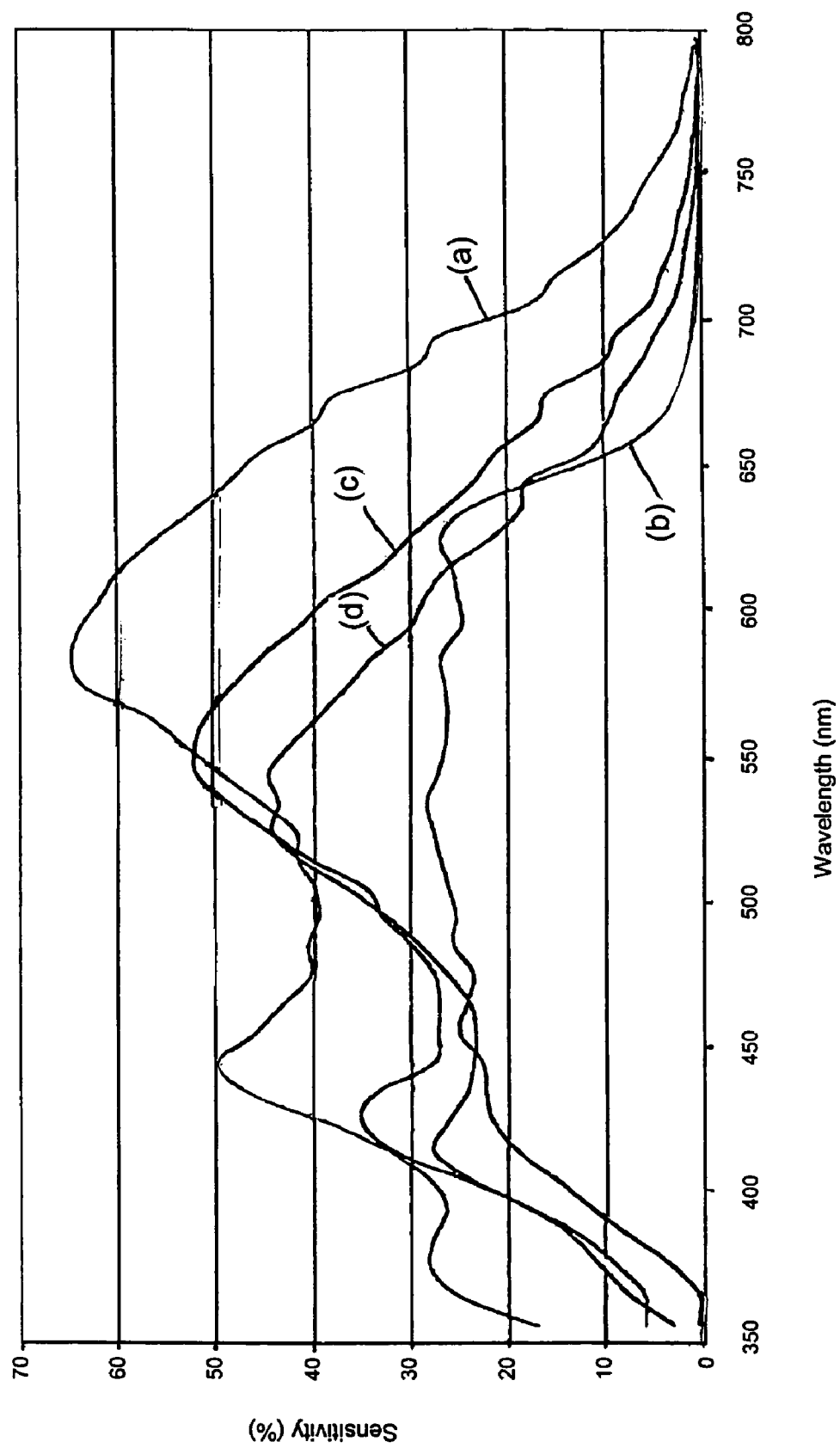
FIG. 4 shows a comparison of the spectral sensitivities of optoelectronic components, in each case in the wavelength band between 350 and 800 nm.

The alloying of the intrinsically conductive a-Si:H layer 7 that is carried out according to the invention with a carbon alloy as specified above leads to the spectral profiles which are represented by the curves c, d in FIG. 4. The spectral sensitivity within the infrared band (above 680 nm) is considerably less than that of the curve (a) so that image sensors such as these detect light from the optically visible band while, in contrast, they significantly suppress infrared radiation. In comparison, curve b in FIG. 4 shows the absorption curve for a sensor which is equipped using conventional technology, is known from the prior art and uses an additional filter (interference filter or colored glass filter) for infrared suppression.

Having thus described at least one illustrative embodiment of the invention, various alterations, modifications, and improvements will readily occur to those skilled in the art. Such alterations, modifications, and improvements are intended to be within and scope of the invention. Accordingly, the foregoing description is by way of example only and is not as limiting. The invention is limited only as defined in the following claims and the equivalents thereto.

What is claimed is:

1. An optoelectronic component for conversion of electromagnetic radiation to an intensity-dependent photocurrent comprising a substrate with a microelectronic circuit, on whose surface a first layer which makes electrical contact with this and is composed of intrinsically conductive amorphous silicon or of its alloys is arranged, with at least one further optically active layer being arranged upstream in the light incidence direction of the first layer wherein the first layer is produced from intrinsically conductive amorphous silicon by alloying it with carbon in a concentration of 2 to 15% by atomic weight, such that the band gap of the semiconductor material in the first layer is at least 1.8 eV, wherein the optoelectronic component converts electromagnetic radiation into the photocurrent in response to receiving the electromagnetic radiation by the first layer, and converts a greater proportion of electromagnetic radiation having wavelengths less than about 680 nm when received by the first layer than electromagnetic radiation having wavelengths greater than about 680 nm when received by the first layer.

2. The optoelectronic component as claimed in claim 1, wherein the microelectronic circuit is a single semiconductor transistor or a switching diode.

3. The optoelectronic component as claimed in claim 2, wherein a further layer in the form of an X-ray active scintillation layer is arranged upstream in the light incidence direction.

4. The optoelectronic component as claimed in claim 1, with this optoelectronic component being a matrix-organized image sensor device which is structured in pixels, wherein the microelectronic circuit is an application-specific circuit, with the at least one further layer being a doped semiconductive layer upstream of which, in the light incidence direction, a conductive layer composed of a transparent oxide is arranged.

5. The optoelectronic component as claimed in claim 4, wherein a second doped semiconductive layer is arranged downstream from the first layer in the light incidence direction, with the layer sequence of the photodiode that is formed in this way being p-i-n or n-i-p.

6. The optoelectronic component as claimed in claim 1, wherein the optoelectronic component is in the form of a Schottky photodiode.

7. The optoelectronic component of claim 1, wherein the optoelectronic component has a higher sensitivity to visible radiation than to infrared radiation.

8. The optoelectronic component of claim 1, wherein the optoelectronic component has a higher sensitivity to electromagnetic radiation having wavelengths between about 380 nm and 680 nm when received by the first layer than to electromagnetic radiation having wavelengths greater than about 680 nm when received by the first layer.

9. A method for producing an electronic component for conversion of electromagnetic radiation to an intensity-dependent photocurrent, in which a first layer which makes electrical contact with the circuit and is composed of amorphous silicon or of its alloys is applied to a substrate which contains a microelectronic circuit, on which, in turn, at least one further optically active layer is arranged, wherein the first layer is produced from intrinsically conductive amorphous silicon by alloying it with carbon using a silane/methane gas mixture in a volume ratio of between about 1.7:1 and 1:1, such that the band gap of the semiconductor material in the first layer is at least 1.8 eV.

10. The method for producing an electronic component as claimed in claim 9, wherein hydrogen is additionally added, in a concentration of between about 75 to 95% by volume, with respect to the total gas flow (silane+methane+hydrogen).

11. The method for producing an electronic component as claimed in claim 9, wherein the band gap of the intrinsically conductive amorphous silicon layer is in the range from 1.8 to 2.0 eV.

12. The method for producing an electronic component as claimed in claim 9, wherein the silane/methane mixture ratio during the deposition process is approximately 1.67:1.

13. The method for producing an electronic component as claimed in claim 9, wherein the layer of amorphous silicon is applied by means of the PECVD method composed of silane and possibly other gases.

14. The method of claim 9, wherein electronic component has a higher sensitivity to visible radiation than to infrared radiation.

15. The method of claim 9, wherein the electronic component has a higher sensitivity to electromagnetic radiation having wavelengths less than about 680 nm when received by the first layer than to electromagnetic radiation having wavelengths greater than about 680 nm when received by the first layer.

16. The method of claim 15, wherein the electronic component has a higher sensitivity to electromagnetic radiation having wavelengths between about 380 nm and 680 nm when received by the first layer than to electromagnetic radiation having wavelengths greater than about 680 nm when received by the first layer.

17. An image sensor for producing an electrical signal in response to receiving electromagnetic radiation, comprising:
an first layer of intrinsically conducting material, comprising:
carbon having a concentration of about 2 to 15% by atomic weight; and
a bandgap of at least 1.8 eV;
wherein the image sensor converts electromagnetic radiation into the electrical signal in response to receiving the electromagnetic radiation by the first layer, and has a higher sensitivity to electromagnetic radiation having wavelengths less than about 680 nm when received by the first layer than to electromagnetic radiation having wavelengths greater than about 680 nm when received by the first layer.

18. The image sensor of claim 10, further comprising:
a second layer of extrinsically conducting material that contacts the first layer of intrinsically conducting material.

19. The image sensor of claim 13, further comprising:
a third layer of transparent conductive material that is electrically coupled to the second layer.

20. The image sensor of claim 10, wherein the bandgap is between 1.8 and 2.0 eV.

21. The image sensor of claim 10, wherein the first layer of intrinsically conducting material has a thickness of between about 0.5 and 2.0 microns.

22. The image sensor of claim 10, wherein the image sensor has a higher sensitivity to visible radiation than to infrared radiation.

23. The image sensor of claim 10, wherein the image sensor has a higher sensitivity to electromagnetic radiation having wavelengths between about 380 nm and 680 nm when received by the first layer than to electromagnetic radiation having wavelengths greater than about 680 nm when received by the first layer.

24. A method of forming an image sensor that has a higher sensitivity to received electromagnetic radiation having wavelengths less than about 680 nm than to electromagnetic radiation having wavelengths greater than about 680 nm when the electromagnetic radiation is received by an intrinsically conducting layer, the method comprising:
forming the intrinsically conducting layer by chemical vapor deposition using a silane to methane gas mixture in a volume ratio between about 2:1 and 1:1, such that the bandgap of the intrinsically conducting layer is at least 1.8 eV.

25. The method of claim 14, wherein the volume ratio of silane to methane is approximately 1.67:1.

26. The method of claim 14, wherein the volume ratio of silane to methane is between 1.7:1 and 1:1.

27. The method of claim 14, wherein the chemical vapor deposition comprises plasma enhanced chemical vapor deposition.

28. The method of claim 14, wherein the forming of the intrinsically conducting layer further comprises using hydrogen gas comprising between about 75% and 95% by volume of the total gas volume present in the vicinity of the deposition.

29. The method of claim 14, wherein the image sensor has a higher sensitivity to visible radiation than to infrared radiation.

30. The method of claim 14, wherein the image sensor has a higher sensitivity to electromagnetic radiation having wavelengths between about 380 nm and 680 nm when received by the intrinsically conducting layer than to electromagnetic radiation having wavelengths greater than about 680 nm when received by the intrinsically conducting layer.

31. An image sensor for producing an electrical signal in response to receiving electromagnetic radiation, comprising:
an first layer of intrinsically conducting material, comprising:
carbon having a concentration of about 2 to 15% by atomic weight; and
a bandgap of at least 1.8 eV;

wherein the image sensor converts electromagnetic radiation into the electrical signal in response to receiving electromagnetic radiation by the first layer, and suppresses the conversion of electromagnetic radiation having wavelengths greater than about 680 nm when received by the first layer.

32. The image sensor of claim 31, further comprising:
a second layer of extrinsically conducting material that contacts the first layer of intrinsically conducting material.

33. The image sensor of claim 32, further comprising:
a third layer of transparent conductive material that is electrically coupled to the second layer.

34. The image sensor of claim 31, wherein the bandgap is between 1.8 and 2.0 eV.

35. The image sensor of claim 31, wherein the first layer of intrinsically conducting material has a thickness of between about 0.5 and 2.0 microns.

36. The image sensor of claim 31, wherein the image sensor has a higher suppression of infrared radiation than of visible radiation.

37. The image sensor of claim 31, wherein the image sensor has a lower suppression of electromagnetic radiation having wavelengths between about 380 nm and 680 nm when received by the first layer than to electromagnetic radiation having wavelengths greater than about 680 nm when received by the first layer.

* * * * *